(12) United States Patent
Brauneis et al.

(10) Patent No.: US 12,304,405 B2
(45) Date of Patent: May 20, 2025

(54) METHOD FOR PREDICTING THE ENERGY REQUIREMENTS OF A MOTOR VEHICLE

(71) Applicant: MERCEDES-BENZ GROUP AG, Stuttgart (DE)

(72) Inventors: Daniel Brauneis, Passau (DE); Julian Müller, Deckenpfronn (DE); Roland Lindbüchl, Böblingen (DE); Simone König, Ellwangen (DE)

(73) Assignee: MERCEDES-BENZ GROUP AG, Stuttgart (DE)

( * ) Notice: Subject to any disclaimer, the term of this patent is extended or adjusted under 35 U.S.C. 154(b) by 0 days.

(21) Appl. No.: 18/722,323

(22) PCT Filed: Nov. 28, 2022

(86) PCT No.: PCT/EP2022/083499
§ 371 (c)(1),
(2) Date: Jun. 20, 2024

(87) PCT Pub. No.: WO2023/117318
PCT Pub. Date: Jun. 29, 2023

(65) Prior Publication Data
US 2024/0416853 A1 Dec. 19, 2024

(30) Foreign Application Priority Data
Dec. 21, 2021 (DE) .................. 10 2021 006 280.9

(51) Int. Cl.
*B60R 16/03* (2006.01)
*B60W 40/12* (2012.01)
*B60W 50/00* (2006.01)

(52) U.S. Cl.
CPC ............. *B60R 16/03* (2013.01); *B60W 40/12* (2013.01); *B60W 50/0097* (2013.01)

(58) Field of Classification Search
USPC ........................................... 701/99
See application file for complete search history.

(56) References Cited

U.S. PATENT DOCUMENTS 10,464,547 B2 * 11/2019 Park ............... B60W 20/40
2016/0358475 A1 * 12/2016 Prokhorov ......... G05D 1/0088
(Continued)

FOREIGN PATENT DOCUMENTS

CN 101519073 A 9/2009
CN 203405557 U 1/2014
(Continued)

OTHER PUBLICATIONS

Intention to Grant dated May 21, 2024 in related/corresponding EP Application No. 22 822 516.5.
(Continued)

*Primary Examiner* — Adam D Tissot
(74) *Attorney, Agent, or Firm* — PATENT PORTFOLIO BUILDERS PLLC

(57) ABSTRACT

The energy requirement of a motor vehicle is predicted using an artificial functional model generated or trained by an artificial intelligence of a motor vehicle model. The energy requirement of a motor vehicle is predicted using a data recorder arranged on a data bus of the motor vehicle recording bus data communicated via the data bus. An artificial functional model previously generated or trained is provided on the motor vehicle and supplied with the recorded bus data of the motor vehicle. The artificial functional model then provides predicted total power requirement data, which represent the predicted total power requirement of the motor vehicle or the predicted power requirement of individual components of the motor vehicle.

4 Claims, 2 Drawing Sheets

(56) References Cited

U.S. PATENT DOCUMENTS

Figure 1:
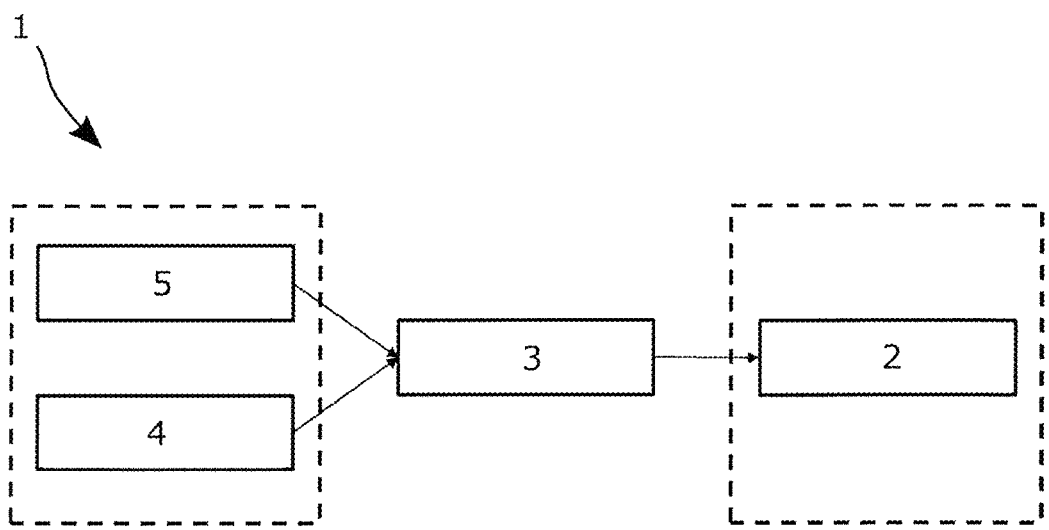

2019/0161076 A1\* 5/2019 Plianos ................ B60W 10/04
2021/0116907 A1\* 4/2021 Altman ............ B60W 60/0015

FOREIGN PATENT DOCUMENTS

| CN | 105151040 A | 12/2015 |
| CN | 109141459 A | 1/2019 |
| CN | 112074790 A | 12/2020 |
| DE | 102013109348 A1 | 3/2015 |
| DE | 202015106567 U1 | 1/2016 |
| DE | 102015226229 A1 | 6/2017 |
| DE | 102018211575 A1 | 1/2020 |
| DE | 202018106059 U1 | 1/2020 |
| DE | 102020107001 A1 | 9/2021 |
| WO | 2019017991 A1 | 1/2019 |

OTHER PUBLICATIONS

International Search Report and Written Opinion mailed Feb. 22, 2023 in related/corresponding International Application No. PCT/EP2022/083499.
Office Action created Sep. 9, 2022 in related/corresponding DE Application No. 10 2021 006 280.9.
Riedel; "Analysen im komplexen Fahrzeug-Bordnetz, Lückenlos und hochaufgelöst;" all-electronics; Oct. 13, 2016; https://www.all-electronics.de/automotive-transportation/lueckenlos-und-hochaufgeloest.html.
Office Action dated Dec. 13, 2024 in related/corresponding CN Application No. 202280084301.

\* cited by examiner

METHOD FOR PREDICTING THE ENERGY REQUIREMENTS OF A MOTOR VEHICLE

BACKGROUND AND SUMMARY OF THE INVENTION

Exemplary embodiments of the invention relate to a method for predicting the energy requirement of a motor vehicle.

A method of the type mentioned above is known from DE 20 2018 106 059 U1, which discloses a system for recording the electrical power requirements of bus participants in a bus system in the field of building technology.

Exemplary embodiments of the invention are directed to provide or indicate an improved or at least a different method for predicting energy requirements.

The core idea of the invention is to record power requirement and bus data from a motor vehicle model of a motor vehicle type used, for example, in the context of motor vehicle development and to make these available to an artificial intelligence, which is thereby able to generate and/or train a so-called artificial functional model.

An artificial functional model generated and/or trained in this way can therefore be prepared at the factory in order to then be integrated into a market-ready motor vehicle of this motor vehicle type or a similar motor vehicle type or to be implemented in a control unit of the motor vehicle.

In order to be able to offer a user of the motor vehicle a forecast of the energy requirement of the motor vehicle, according to the invention only bus data recorded on the motor vehicle are then provided to the artificial functional model, which translates them into a corresponding forecast of the energy requirement of the motor vehicle.

For this purpose, the invention proposes a method for predicting the energy requirements of a motor vehicle, in which the following steps are carried out:

1) Generating and/or training an artificial functional model by means of an artificial intelligence, hereinafter referred to as AI, of a motor vehicle model by providing the motor vehicle model with measuring sensors arranged on power fuses or on an electrical consumer of the motor vehicle model for detecting the power requirement of each power fuse of the motor vehicle model and with at least one data recorder arranged on a data bus of the motor vehicle model for detecting bus data exchanged via the data bus. Then, by means of the measuring sensors, a current requirement at each current fuse can be recorded and current requirement data representing this current requirement can be provided, wherein bus data is recorded and provided by means of the at least one data recorder. The determined bus data and power requirement data are then stored and synchronized in a memory, in particular a memory of the motor vehicle model and/or a motor vehicle.

The stored, synchronized bus data and power requirement data can then be provided as so-called training data to the AI of the motor vehicle model, whereby the AI generates and/or trains an artificial functional model based on the provided bus data and power requirement data. The artificial functional model represents or thereby creates a correlation between the bus data and the power requirement data. In a subsequent step 2), it is provided that the energy requirement of a motor vehicle is predicted by providing it with at least one data recorder arranged on a data bus of the motor vehicle for recording bus data exchanged via the data bus of the motor vehicle, by means of which at least one data recorder of the motor vehicle records and provides bus data of the motor vehicle, wherein an artificial functional model generated and/or trained according to step 1) is provided on the motor vehicle and supplied with the recorded bus data of the motor vehicle.

This enables the artificial functional model (hereinafter referred to as PGS data) to provide predicted total power requirement data representing the predicted total power requirement of the motor vehicle or the predicted power requirement of individual power fuses and/or electrical consumers of the motor vehicle.

In other words, the method according to the invention proposes, in a step 1), to first generate and/or create an artificial functional model by means of a AI using data from a vehicle model of a given vehicle type. Step 1) of the method according to the invention can therefore preferably be carried out on site at the manufacturer as part of the development of the motor vehicle type. According to step 2), the artificial functional model generated and/or trained by the manufacturer is made available to a motor vehicle of this motor vehicle type or a similar motor vehicle type, for example wirelessly via radio or wired as part of a motor vehicle service in a workshop or further, for example wired or via radio already during production as part of the series equipment of the motor vehicle. In step 2), the total power requirement of the motor vehicle can then be predicted using bus data recorded on the respective motor vehicle and the artificial functional model provided, by the artificial functional model translating the data into a corresponding forecast of the motor vehicle's energy requirement.

Advantageously, the power requirements of individual systems and/or components of the motor vehicle can be predicted.

The invention intends the expression "evaluation of the energy requirement" to mean the approximation or estimation of the energy requirement of the motor vehicle.

Furthermore, the invention intends the term "provide" to mean, in particular, an integration and/or an implementation.

The bus data determined are expediently used during the generation and/or training of the AI according to step 1) and/or during the forecasting of the energy requirement of a motor vehicle according to step 2) to improve the artificial functional model.

This makes it possible to realize so-called deep reinforcement learning, i.e., the artificial functional model installed in a motor vehicle model and/or a motor vehicle is continuously trained and/or adapted. This makes it possible for the artificial functional model, for example, to react to driving styles of different users of the motor vehicle model and/or a motor vehicle, whereby a predicted energy requirement of the motor vehicle model and/or a motor vehicle can be individually adapted or calculated or computed or approximated.

In order to be able to carry out the improvement of the artificial function model, it can be provided that the determined bus data have total power requirement data, which are referred to below as GS data for the sake of simplicity. They represent the actual total power requirement of the vehicle. The artificial functional model is then used to provide the PGS data, which represent the predicted total power requirement of the motor vehicle, whereby the GS data are compared with the PGS data, for example in a comparator of the motor vehicle or the artificial functional model. The artificial functional model is expediently designed to determine a deviation between the GS data and the PGS data, i.e., a deviation between the actual total power requirement of the motor vehicle and the predicted total power requirement of the motor vehicle. The artificial functional model is furthermore suitably designed to influence this determined deviation, in particular to minimize it. In order to realize the desired improvement of the artificial function model, the artificial function model causes a minimization of the deviation between the GS data and the PGS data to be realized when the GS data deviate from the PGS data.

This will result in an improved learning effect for the class. This has the particular advantage that, for example, given a given remaining capacity of a motor vehicle's energy storage system, the remaining range of the motor vehicle can be better predicted. In addition, based on previous driving behavior and the use of individual systems of the motor vehicle during the journey, the driver can more accurately estimate the energy requirements of individual components of the motor vehicle, which enables a relatively accurate forecast of the remaining range of the motor vehicle. Furthermore, a user of the motor vehicle can be given targeted suggestions for saving energy, for example that certain consumers of the motor vehicle are deactivated in order to increase the remaining range of the vehicle. In addition, it is conceivable that other consumers of the motor vehicle are automatically controlled or regulated based on the current forecast of the AI, for example by a control unit of the motor vehicle.

Furthermore, the PGS data are expediently provided to and/or used in a control unit of the motor vehicle.

Conveniently, the AI and/or the artificial functional model can also be provided on a control unit of the motor vehicle and/or integrated therein. As a result, the method according to the invention can be easily and inexpensively provided on a motor vehicle. Conveniently, the artificial functional model is preferably used in motor vehicles of a single motor vehicle type and/or development environment. However, as already indicated, the artificial functional model in question can also be used for motor vehicles of a similar or completely different motor vehicle type. This means that the artificial functional model can be used across vehicle types to provide estimates of the energy requirements of individual motor vehicles. This allows the proposed artificial functional model to be implemented relatively cost-effectively.

Furthermore, the PGS data of a motor vehicle are expediently provided and/or used at a backend, in particular a stationary location remote from the motor vehicle, for example a server.

This allows the energy requirements of a group of vehicles of one type to be recorded and monitored externally.

It may be expedient for the said artificial functional model to be implemented by an artificial neural network or a regression model or an alternative machine learning model.

This provides several advantageous artificial functional models. It goes without saying that, expediently, further and preferably all classes, types and methods of artificial functional models and/or artificial neural networks can also be included.

In summary, the invention expediently relates to a method for predicting the energy requirement of a motor vehicle.

It is essential that an artificial functional model is generated and/or trained by means of an artificial intelligence of a motor vehicle model, referred to as AI, and that in a subsequent step the energy requirement of a motor vehicle is predicted by providing at least one data recorder arranged on a data bus of the motor vehicle for recording bus data exchanged via the data bus, wherein bus data is recorded by means of the at least one data recorder, wherein an artificial functional model previously generated and/or trained according to the method is provided on the motor vehicle and supplied with the recorded bus data of the motor vehicle, wherein the artificial functional model then provides predicted total power requirement data which represents the predicted total power requirement of the motor vehicle or the predicted power requirement of individual components of the motor vehicle.

Further important features and advantages of the invention emerge from the subclaims, from the drawings and from the associated description of the figures with reference to the drawings.

It is understood that the features mentioned above and those to be explained below can be used not only in the combination specified in each case, but also in other combinations or on their own, without departing from the scope of the present invention.

A preferred embodiment of the invention is illustrated in the drawings and explained in more detail in the following description, wherein identical reference numerals refer to identical or similar or functionally identical components.

BRIEF DESCRIPTION OF THE DRAWING FIGURES

Figure 2:
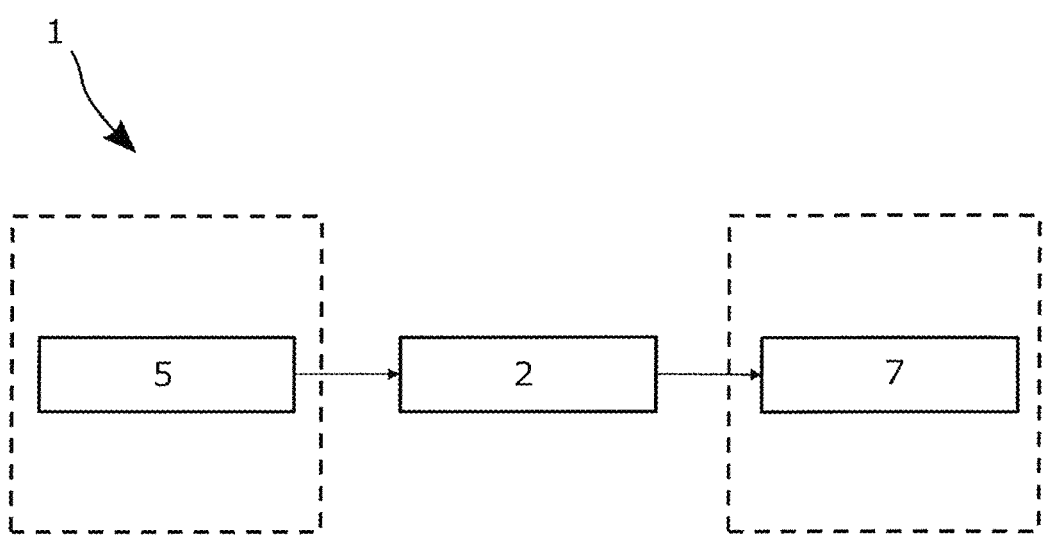
Figure 3:
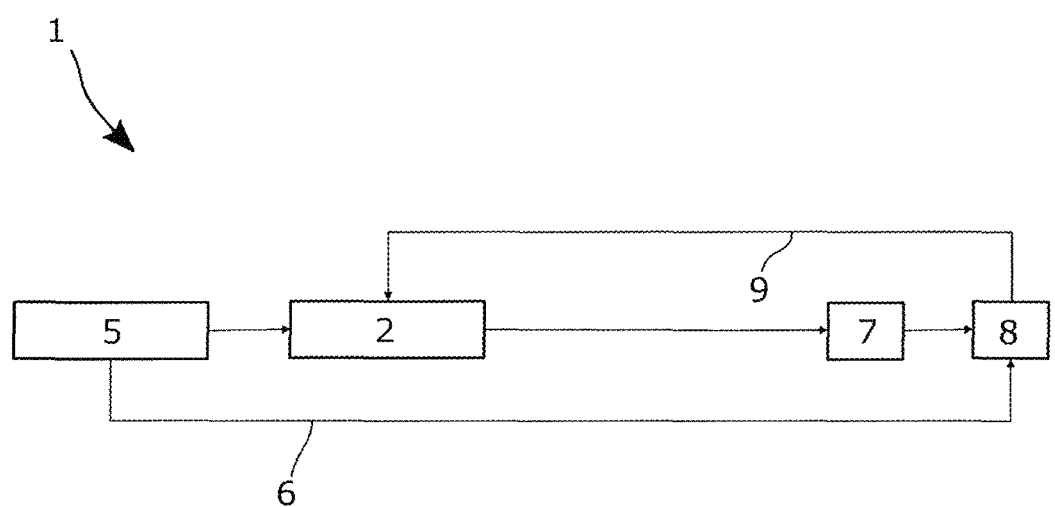

The diagrams show:

FIG. 1 shows a flow chart of the generation and/or training of an artificial function model according to a preferred embodiment of the method according to the invention, FIG. 2 shows in a further flow chart the prediction of the energy requirement of a motor vehicle according to a preferred embodiment of the method according to the invention and finally FIG. 3 shows a further flow chart of so-called deep reinforcement learning with an artificial functional model according to a preferred embodiment of the method according to the invention.

DETAILED DESCRIPTION

FIG. 1 shows in a flow chart the generation and/or training of an artificial functional model 2 according to a preferred embodiment of the method 1 according to the invention for predicting the energy requirement of a non-illustrated motor vehicle model.

The illustrated method 1 comprises a step 1) according to which an artificial functional model 2 symbolized by a box is generated and/or trained by means of an artificial intelligence 3 of the motor vehicle model, hereinafter referred to as AI.

For this purpose, it is provided that the motor vehicle model is provided with measuring sensors arranged on power fuses of the motor vehicle model for detecting a power requirement of each power fuse of the motor vehicle model and for providing power requirement data 4 representing the detected power requirement, as well as with at least one data recorder arranged on a data bus of the motor vehicle model for detecting bus data 5 exchanged via the data bus.

Within the scope of method 1, a current requirement at each power fuse is then recorded by means of the measuring sensors and further current requirement data 4 are provided, which represent these recorded current requirements.

Within the scope of method 1, bus data 5 are further recorded and provided by means of the at least one data recorder.

The bus data 5 and power requirement data 4 are then stored in a non-illustrated memory and time-synchronized, in particular in such a way that the individual bus data 5 are assigned temporally correlated power requirement data 4.

In FIG. 1, both the power requirement data 4 and the bus data 5 are symbolized by a simple box.

In order to generate and/or train the artificial functional model 2, it is further provided that the stored, time-synchronized bus data 5 and power requirement data 4 are provided and processed as so-called training data at the AI 3 of the motor vehicle model, in such a way that the AI 3 can generate and/or train the artificial functional model 2 as a result based on the provided bus data 5 and power requirement data 4.

FIG. 2 shows in a further flow chart the forecasting of the energy requirement of a non-illustrated, market-ready motor vehicle according to a preferred embodiment of the method 1 according to the invention.

The illustrated method 1 expediently comprises a step 2) according to which the energy requirement of the motor vehicle can be predicted by first providing the motor vehicle with at least one data recorder arranged on a data bus of the motor vehicle for recording bus data 5 exchanged via the data bus of the motor vehicle. Within the scope of step 2) of the method 1, it is then provided that bus data 5 of the motor vehicle are recorded and provided by means of the at least one data recorder of the motor vehicle during actual operation of the motor vehicle. A pre-generated and/or a trained artificial functional model 2, which is also provided on the motor vehicle, can now be supplied with the recorded bus data 5 so that it then determines and provides predicted total power requirement data 7, hereinafter referred to as PGS data. This PGS data 7 represents the predicted total power requirement of the motor vehicle or the predicted power requirement of individual power fuses of the motor vehicle.

In FIG. 3, a so-called deep reinforcement learning (from the English "Deep Reinforcement Learning") with an artificial functional model 2 according to a preferred embodiment of the method 1 according to the invention is shown using a further flow chart.

It is provided here that the bus data 5 determined according to step 1) and/or 2) of the method 1 according to the invention are used to train or at least adapt or optimize the artificial functional model 2 previously provided on a motor vehicle model and/or on a motor vehicle according to step 1) and/or 2) of the method 1 according to the invention. For this purpose, it is provided by way of example that the determined bus data 5 have or include total power requirement data 6, referred to as GS data, which represent the actual total power requirement of the motor vehicle model or the motor vehicle, and that PGS data 7 are provided by means of the artificial functional model 2, which—as mentioned—represent the predicted total power requirement of the motor vehicle model and/or the motor vehicle. The GS data 6 are then compared with the PGS data 7 in a comparator 8. By way of example, the artificial functional model 2 is configured to minimize a deviation 9 between the GS data 6 and the PGS data 7, in particular by feeding a determined deviation 9 back from the comparator 8 to the artificial functional model 2.

Deep reinforcement learning is then achieved in particular by the artificial functional model 2 causing a minimization of a determined deviation 9 between the GS data 6 and the PGS data 7 if the GS data 6 actually deviate from the PGS data 7.

Although the invention has been illustrated and described in detail by way of preferred embodiments, the invention is not limited by the examples disclosed, and other variations can be derived from these by the person skilled in the art without leaving the scope of the invention. It is therefore clear that there is a plurality of possible variations. It is also clear that embodiments stated by way of example are only really examples that are not to be seen as limiting the scope, application possibilities or configuration of the invention in any way. In fact, the preceding description and the description of the figures enable the person skilled in the art to implement the exemplary embodiments in concrete manner, wherein, with the knowledge of the disclosed inventive concept, the person skilled in the art is able to undertake various changes, for example, with regard to the functioning or arrangement of individual elements stated in an exemplary embodiment without leaving the scope of the invention, which is defined by the claims and their legal equivalents, such as further explanations in the description.

The invention claimed is:

1. A method for predicting energy requirements of a motor vehicle, the method comprising:
   1) Generating or training an artificial intelligence model by an artificial intelligence of a motor vehicle model by
      detecting, by measuring sensors arranged on power fuses of the motor vehicle model, a power requirement of the motor vehicle model and providing power requirement data representing the detected power requirement;
      recording, by at least one data recorder arranged on a data bus of the motor vehicle, bus data;
      time-synchronizing the bus data and power requirement data storing the time-synchronized bus data and power requirements in a memory as training data;
      providing the training data to the artificial intelligence of the motor vehicle model;
      generating or training, by the artificial intelligence, the artificial intelligence model based on the stored, time-synchronized bus data and power requirement data, wherein the artificial intelligence model represents a correlation between the stored, time-synchronized bus data and the power requirement data; and
   2) predicting the energy requirements of the motor vehicle by
      recording, by at least one data recorder arranged on a data bus of the motor vehicle while the motor vehicle is operating, bus data communicated via the data bus of the motor vehicle;
      providing, by the at least one data recorder arranged on a data bus of the motor vehicle, the bus data of the operating motor vehicle,
      providing the artificial intelligence model generated or trained according to step 1) on the motor vehicle;
      supplying the artificial intelligence model generated or trained according to step 1) that is provided on the motor vehicle with the bus data of the operating motor vehicle;
      determining and providing, by the artificial intelligence model generated or trained according to step 1) that is provided on the motor vehicle, predicted total power requirement data representing a predicted total power requirement of the motor vehicle or a total of predicted power requirements of individual power fuses or electrical consumers of the motor vehicle,
      updating the artificial intelligence model, using the provided bus data of the motor vehicle, during the generation or training of the artificial intelligence according to step 1) or during the predicting of the energy requirements of the motor vehicle according to step 2), wherein the provided bus data of the motor vehicle contain total power requirement data representing an actual total power requirement of the motor vehicle;

providing, by the artificial intelligence model, the predicted total power requirement data;

comparing the total power requirement data with the predicted total power requirement data to determine a deviation between the total power requirement data and the predicted total power requirement data; and minimizing, by the artificial intelligence model when the total power requirement data deviates from the predicted total power requirement data, the deviation between the total power requirement data and the predicted total power requirement data.

2. The method of claim 1, wherein the predicted total power requirement data are provided to or used on a control unit of the motor vehicle or a development environment.

3. The method of claim 1, wherein the predicted total power requirement data of the motor vehicle are provided or used at a backend, which is a server that is at a stationary location remote from the motor vehicle.

4. The method of claim 1, wherein the artificial intelligence model is an artificial neural network, a regression model, or an alternative machine learning model.

* * * * *